(12) United States Patent
Im

(10) Patent No.: US 12,317,480 B2
(45) Date of Patent: May 27, 2025

(54) SEMICONDUCTOR DEVICE AND METHOD FOR FABRICATING THE SAME

(71) Applicant: SK hynix Inc., Gyeonggi-do (KR)

(72) Inventor: Mir Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 530 days.

(21) Appl. No.: 17/847,847

(22) Filed: Jun. 23, 2022

(65) Prior Publication Data

US 2023/0171946 A1    Jun. 1, 2023

(30) Foreign Application Priority Data

Nov. 30, 2021   (KR) .......................... 10-2021-0169549

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02); *H10B 12/482* (2023.02)

(58) Field of Classification Search
CPC .............................. H10B 12/30; H10B 12/482
See application file for complete search history.

(56) References Cited

U.S. PATENT DOCUMENTS

| | | | |
|---|---|---|---|
| 6,642,591 B2 | 11/2003 | Ikeda et al. | |
| 2015/0357429 A1* | 12/2015 | Dubourdieu | H10D 64/033 257/295 |
| 2020/0279601 A1* | 9/2020 | Kim | G11C 11/4097 |
| 2021/0036020 A1 | 2/2021 | Park et al. | |

\* cited by examiner

*Primary Examiner* — Douglas M Menz
(74) *Attorney, Agent, or Firm* — IP & T GROUP LLP

(57) ABSTRACT

A semiconductor device includes: a substrate; a seed layer over the substrate; a perovskite-based channel layer over the seed layer; a bit line coupled to one side of the perovskite-based channel layer and extending in a direction perpendicular to the substrate; a capacitor coupled to another side of the perovskite-based channel layer; a word line crossing an upper surface of the perovskite-based channel layer; and a gate dielectric layer disposed between the word line and the perovskite-based channel layer.

20 Claims, 14 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2021-0169549, filed on Nov. 30, 2021, which is incorporated herein by reference in its entirety.

BACKGROUND

1. Field

Various embodiments of the present invention relate to a semiconductor device, and more particularly, to a semiconductor device having a perovskite-based transistor and a method of manufacturing the same.

2. Description of the Related Art

Semiconductor devices such as NAND, a Resistive Random Access Memory (ReRAM), and a Dynamic Random Access Memory (DRAM) are being highly integrated. Such semiconductor devices may include memory cells that store data.

Recently, a semiconductor device in which memory cells are three-dimensionally arranged has been proposed.

SUMMARY

Embodiments of the present invention are directed to a semiconductor device including a perovskite-based transistor and a method for fabricating the same.

In accordance with an embodiment of the present invention, a semiconductor device includes: a substrate; a seed layer over the substrate; a perovskite-based channel layer over the seed layer; a bit line coupled to one side of the perovskite-based channel layer and extending in a direction perpendicular to the substrate; a capacitor coupled to another side of the perovskite-based channel layer; a word line crossing an upper surface of the perovskite-based channel layer; and a gate dielectric layer disposed between the word line and the perovskite-based channel layer.

In accordance with another embodiment of the present invention, a semiconductor device includes: a substrate; a perovskite-based transistor including a perovskite-based channel layer which is laterally oriented parallel to the substrate over the substrate; a bit line coupled to one side of the perovskite-based transistor and extending in a direction perpendicular to the substrate; and a capacitor coupled to another side of the perovskite-based transistor.

In accordance with yet another embodiment of the present invention, a semiconductor device includes: a perovskite-based transistor over a substrate; a bit line coupled to one side of the perovskite-based transistor and extending in a direction perpendicular to the substrate; and a capacitor coupled to another side of the perovskite-based transistor, wherein the perovskite-based transistor includes: a perovskite-based channel layer laterally oriented to be parallel to the substrate; a perovskite-based gate dielectric layer over the perovskite channel layer; and a perovskite-based word line over the perovskite-based gate dielectric layer.

In accordance with yet another embodiment of the present invention, a semiconductor device includes: a substrate; a seed layer over the substrate; a perovskite-based channel layer over the seed layer; a bit line coupled to one side of the perovskite-based channel layer and extending in a direction perpendicular to the substrate; a capacitor including a multi-cylinder storage node coupled to another side of the perovskite-based channel layer; a word line crossing an upper surface of the perovskite-based channel layer; and a gate dielectric layer disposed between the word line and the perovskite-based channel layer.

DETAILED DESCRIPTION

Figure 1:
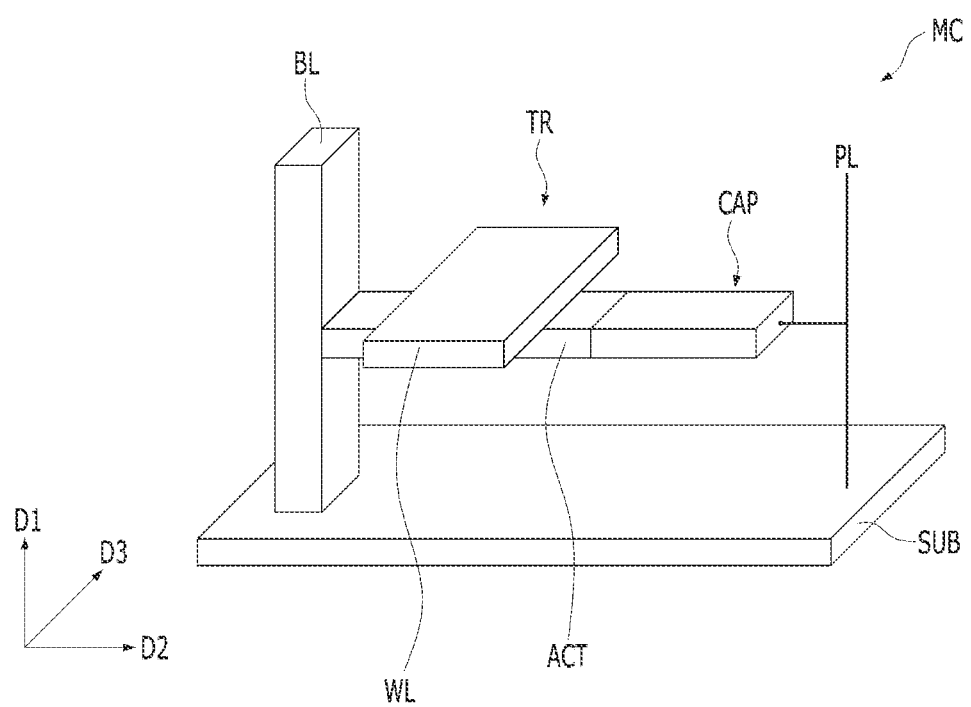
FIG. 1 is a schematic perspective view illustrating a memory cell of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to dearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to an embodiment of the present invention, which will be described later, memory cells may be vertically stacked to increase memory cell density and reduce parasitic capacitance.

Figure 2:
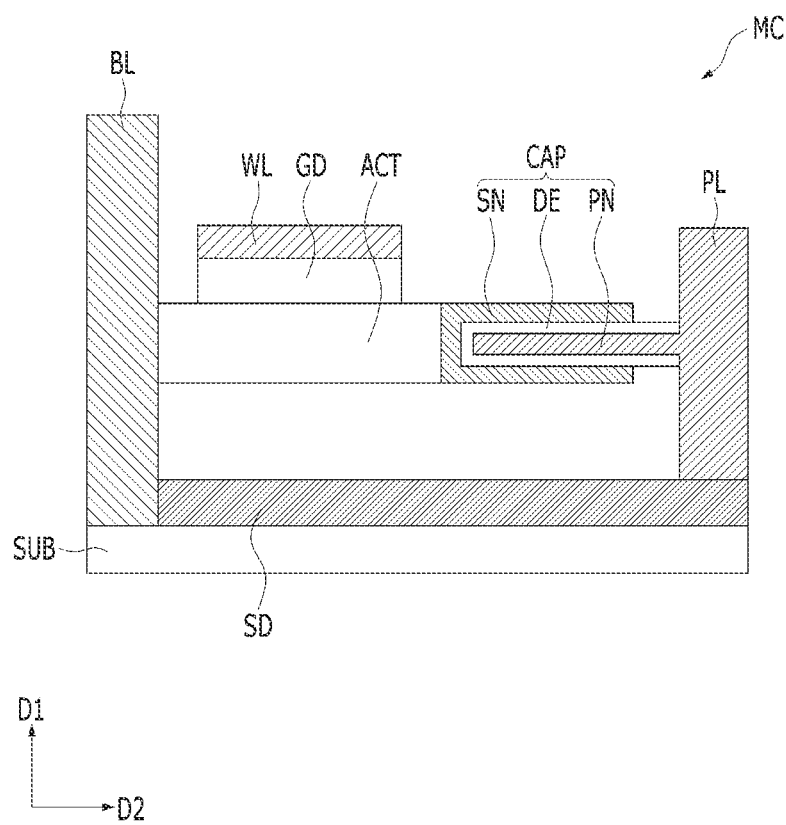
FIG. 2 is a cross-sectional view illustrating the memory cell shown in FIG. 1.

FIG. 1 is a schematic perspective view illustrating a memory cell of a semiconductor device in accordance with an embodiment of the present invention. FIG. 2 is a cross-sectional view illustrating the memory cell shown in FIG. 1.

Referring to FIGS. 1 and 2, the memory cell MC of the 3D semiconductor device in accordance with an embodiment of the present invention may include a substrate SUB, a bit line BL, a transistor TR, and a capacitor CAP. The transistor TR may include a channel layer ACT and a word line WL, and the word line WL may be positioned over the channel layer ACT. The capacitor CAP may include a storage node SN, a dielectric layer DE, and a plate node PN. The channel layer ACT may be positioned over the substrate SUB, and the bit line BL may be coupled to one side of the channel layer ACT and may extend in a direction perpendicular to the substrate SUB. The capacitor CAP may be coupled to the other side of the channel layer ACT. The word line WL may have a line shape crossing the upper surface of the channel layer ACT. A gate dielectric layer GD may be positioned between the word line WL and the channel layer ACT.

More specifically, the bit line BL may have a pillar shape and may extend in a first direction D1 that is perpendicular to a top surface of the substrate SUB. The channel layer ACT may have a bar shape and may extend in a second direction D2 that is parallel to the top surface of the substrate SUB. The channel layer ACT may have a first end thereof in a direct contact with the bit line BL, and a second end in direct contact with the capacitor CAP. The capacitor CAP may include a storage node SN connected to the second end of the channel layer ACT, a plate node PN connected to a plate line PL, and a dielectric layer DE disposed between the storage node SN and the plate PN. The word line WL may have a line shape and may extend in a third direction D3 that is parallel to the top surface of the substrate and perpendicular to the second direction D2. The word line WL may extend over the channel layer ACT and may overlap partially with the channel layer ACT. The dimensions of the bit line, the channel layer and the word line may vary.

The memory cell MC may further include a seed layer SD. The seed layer SD may be positioned over the substrate SUB. The transistor TR may include a perovskite-based transistor. In the perovskite-based transistor, a channel layer (or a channel), a gate dielectric layer, and a word line may all include a perovskite material. For example, a perovskite-based transistor may include a perovskite-based channel layer, a perovskite-based gate dielectric layer, and a perovskite-based gate electrode (or word line).

The seed layer SD may include a perovskite material. The seed layer SD may include a two-dimensional perovskite nanosheet. The seed layer SD may be formed by epitaxial growth. The seed layer SD may include $A_2Na_{n-3}M_nO_{3n+1}^-$ where A is Ca, Sr, or Ba, M is Nb, or Ta, and n satisfies the following expression 3≤n≤6. For example, the seed layer SD may include $Ca_2Nb_3O_{10}^-$. Also, the seed layer SD may include $Ca_2Nb_3O_{10}^-$, $RENb_2O_7^-$ (RE is La), $LaNb_2O_7^-$, $La_{0.9}Eu_{0.05}Nb_2O_7^-$, $(SrTa_2O_7)^{2-}$, $RETa_2O_7^-$ (RE is Eu or Gd), $La_{0.07}Tb_{0.3}Ta_2O_7^-$, or $(Eu_{0.56}Ta_2O_7)^{2-}$. The seed layer SD may be a dielectric perovskite material.

The bit line BL may have a pillar shape extending in a first direction D1. The channel layer ACT may have a bar shape extending in a second direction D2 crossing the first direction D1. The word line WL may have a line shape extending in a third direction D3 crossing the first and second directions D1 and D2. The plate node PN of the capacitor CAP may be coupled to a plate line PL.

The bit line BL may be vertically oriented in the first direction D1. The bit line BL may be referred to as a vertically oriented bit line or a pillar-shaped bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over titanium nitride.

The word line WL may extend long in the third direction D3, and the channel layer ACT may extend in the second direction D2. The channel layer ACT may be arranged laterally in the second direction D2 from the bit line BL. The word line WL may have a single word line structure. A gate dielectric layer GD may be formed over the upper surface of the channel layer ACT.

The channel layer ACT may include a perovskite material. The channel layer ACT may include an epitaxial perovskite material. The channel layer ACT may be a perovskite channel and may include a perovskite material of the formula $MSnO_3$ wherein M may be Ba, Sr, or Zn.

The word line WL may include a perovskite material. The word line WL may include an epitaxial perovskite material. The word line WL may include $LaNiO_3$, $SrRuO_3$, $LaRuO_3$, $(Ba, Sr)RuO_3$, $SrMo_3$, $BaMoO_3$ or $(Sr, Ba)PbO_3$.

A gate dielectric layer GD may be formed between the channel Dyer ACT and the word line WL. The gate dielectric layer GD may include a perovskite material. The gate dielectric layer GD may include an epitaxial perovskite material. For example, the gate dielectric layer GD may include $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$.

The channel layer ACT, the word line WL, and the gate dielectric layer GD may form a perovskite-based transistor. In the perovskite-based transistor, a source/drain formed by impurity doping may be omitted. The perovskite-based transistor may be source/drain free. The perovskite-based transistor may be an N-channel transistor and may operate by changing only the concentration of free electrons without using a hole. For example, in an off state of the gate voltage OV, at may be a depletion mode in which there are no free electrons, and in an on state in which the gate voltage is greater than a threshold voltage, it may be an accumulation mode in which there are many free electrons.

The capacitor CAP may be positioned laterally in the second direction D2 from the transistor TR. The capacitor CAP may include the storage node SN extending laterally from the channel layer ACT in the second direction D2. The capacitor CAP may further include the dielectric layer DE and a plate node PN over the storage node SN, The storage node SN, the dielectric layer DE, and the plate node PN may be arranged laterally in the second direction D2. The storage node SN may have a laterally oriented cylinder-shape. The dielectric layer DE may conformally cover the cylindrical inner wall of the storage node SN. The plate node PN may have a shape extending to the cylindrical inner wall of the storage node SN over the dielectric layer DE. The plate node PN may be coupled to the plate line PL.

The storage node SN may have a three-dimensional structure, and the storage node SN of the three-dimensional structure may have a lateral three-dimensional structure oriented in the second direction D2. As an example of the three-dimensional structure, the storage node SN may have a cylinder shape. According to another embodiment of the present invention, the storage node SN may have a pillar shape or a pylinder shape. The pillar shape may refer to a structure in which a pillar shape and a cylinder shape are merged.

A portion of the plate node PN may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TIN) may serve as a plate node PN of a capacitor CAP, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. High-k materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of a zirconium-based oxide (Zr-based oxide). The dielectric layer DE may have a stacked structure including at least zirconium oxide ($ZrO_2$). The stacked structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). According to another embodiment of the present invention, the dielectric layer DE may be formed of a hafnium-based oxide (Hf-based oxide). The dielectric layer DE may have a stacked structure including at least hafnium oxide ($HfO_2$). The stacked structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer), In the ZA stack, ZAZ stack, HA stack, and HAH stack, aluminum oxide ($Al_2O_3$) may have greater band-gap energy (which is, hereinafter, simply referred to as band-gap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band-gap material having a greater band-gap than the high-k material. The dielectric layer DE may include silicon oxide ($SiO_2$) as another high band-gap material other than aluminum oxide ($Al_2O_3$). Since the dielectric layer DE includes a high band-gap material, leakage current may be suppressed. A high band-gap material may be thinner than a high-k material. According to another embodiment of the present invention, the dielectric layer DE may include a laminated structure in which a high-k material and a high band-gap material are alternately stacked. For example, a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stacked structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with other data storage material. For example, the data storage material may be a phase change material, a magnetic tunnel junction (MTJ), or a variable resistance material.

Figure 3:
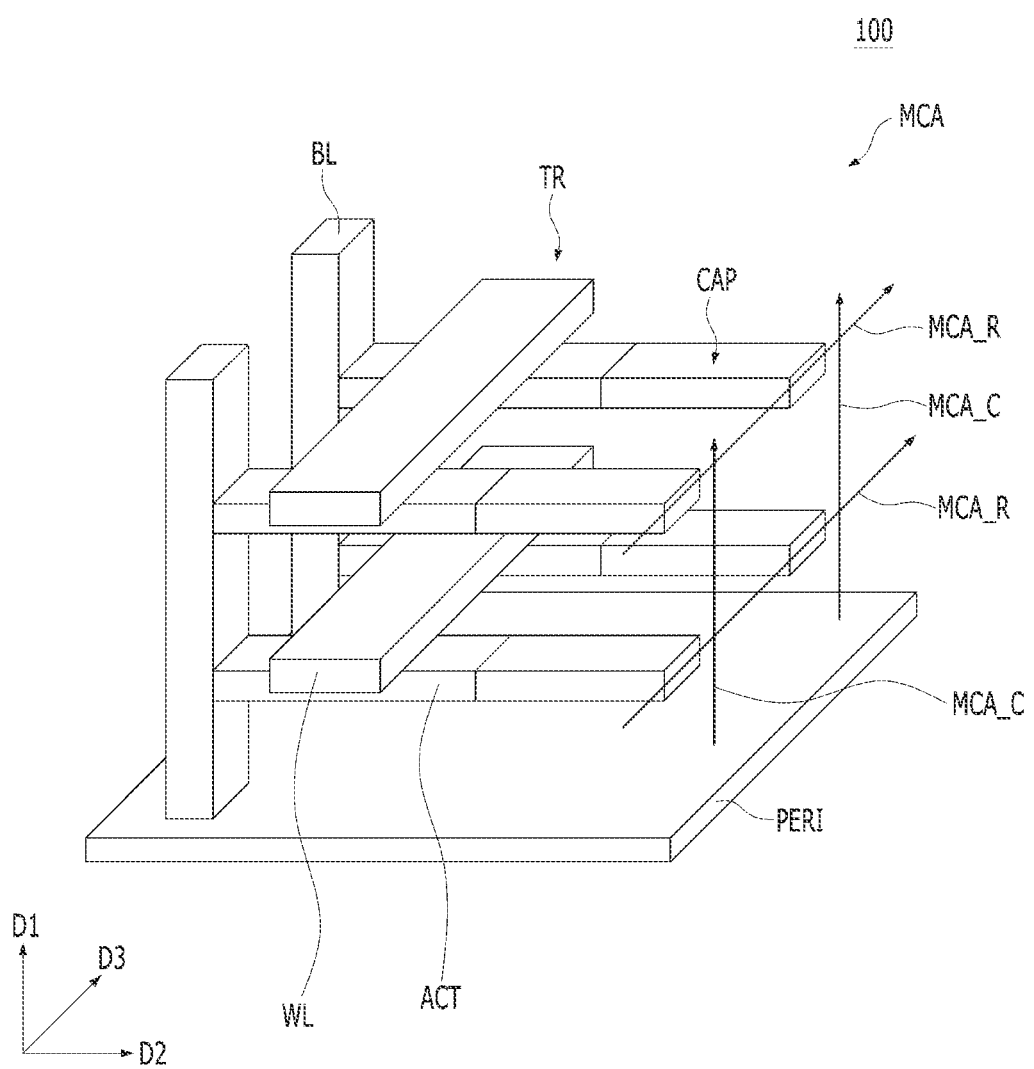
FIG. 3 is a schematic perspective view illustrating a semiconductor device in accordance with an embodiment of the present invention.
Figure 4:
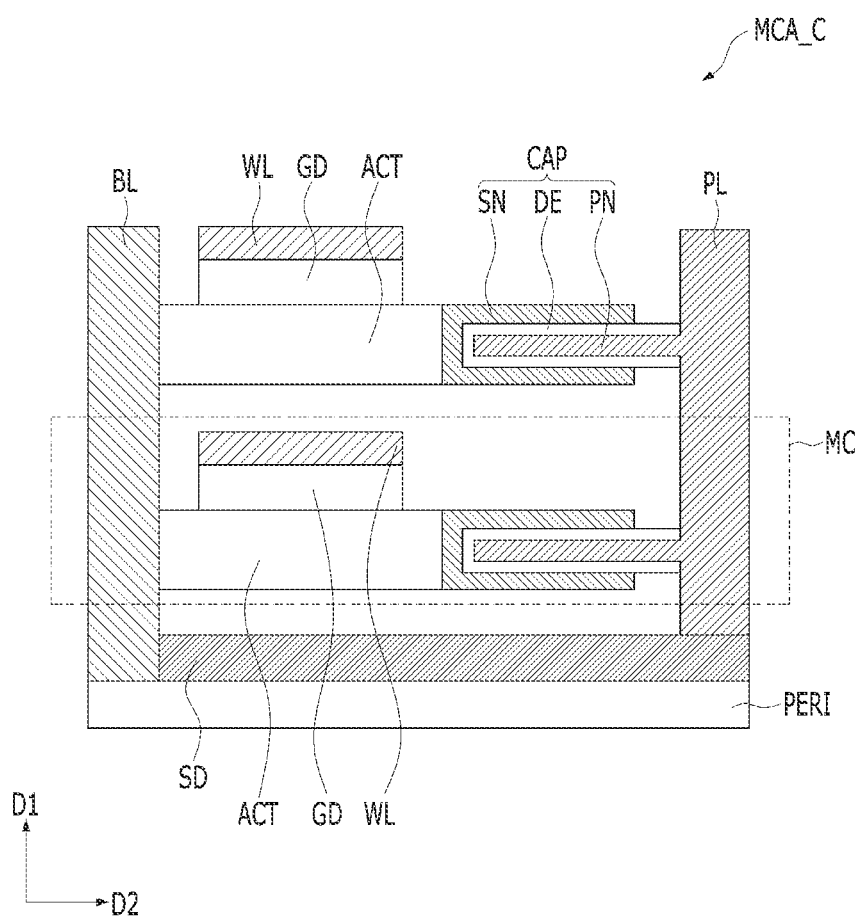
FIG. 4 is a schematic cross-sectional view illustrating a memory cell array of a semiconductor device in accordance with another embodiment of the present invention.

FIG. 3 is a schematic perspective view illustrating a semiconductor device in accordance with an embodiment of the present invention. FIG. 4 is a schematic cross-sectional view illustrating a vertical memory cell array MCA_C shown in FIG. 3.

Referring to FIGS. 3 and 4, the semiconductor device 100 may include a memory cell array MCA. The memory cells MC of FIG. 1 may be arranged in first to third directions D1, D2, and D3 to form the memory cell array MCA shown in FIG. 3. The memory cell array MCA may include a three-dimensional array of memory cells MC, and the three-dimensional memory cell array may include a vertical memory cell array MCA_C and a lateral memory cell array MCA_R. The vertical memory cell array MCA_C may refer to an array of memory cells MC that are vertically arranged in the first direction D1. The lateral memory cell array MCA_R may refer to an array of memory cells MC that are arranged laterally in the third direction D3, The vertical memory cell array MCA_C may be referred to as a column array of memory cells MC, and the lateral memory cell array MCA_R may be referred to as a row array of memory cells MC. The bit line BL may be vertically oriented to be coupled to the vertical memory cell array MCA_C, and the word line WL may be oriented laterally to be coupled to the lateral memory cell array MCA_R. The bit line BL coupled to the vertical memory cell array MCA_C may be referred to as a common bit line, and the vertical memory cell arrays MCA_C positioned adjacent in the third direction D3 may be coupled to different common bit lines. The word line WL coupled to the lateral memory cell array MCA_R may be referred to as a common word line, and the neighboring lateral memory cell arrays MCA_R in the first direction D1 may be coupled to different common word lines.

The memory cell array MCA may include a plurality of memory cells MC, and each memory cell MC may include a vertically oriented bit line BL, a laterally oriented channel layer ACT, a word line WL, and a laterally oriented capacitor CAP. For example, FIG. 3 illustrates a three-dimensional DRAM memory cell array including four memory cells MC.

The neighboring channel layers ACT in the first direction D1 may contact one bit line BL. The neighboring channel layers ACT in the third direction D3 may share a word line WL. The capacitors CAP may each be coupled to a respective one of the channel layers ACT. The capacitors CAP may share one common plate line PL. According to another embodiment of the present invention, the individual channel layer ACT may be thinner than the word line WL.

In the memory cell array MCA, a plurality of word lines WL may be vertically stacked in the first direction D1. Each word line WL may be a single word line. The channel layer ACT may be positioned below the word line WL.

The semiconductor device 100 may further include a peripheral circuit portion PERI. The bit line BL of the memory cell array MCA may be oriented perpendicular to the surface of the peripheral circuit portion PERI in the first direction D1, and the word line WL may be oriented parallel to the surface of the peripheral circuit portion PERI in the third direction D3.

The peripheral circuit portion PERI may be positioned at a lower level than the memory cell array MCA. This may be referred to as a COP (Cell over PERI) structure. The peripheral circuit portion PERI may include at least one control circuit for driving the memory cell array MCA. At least one control circuit of the peripheral circuit portion PERI may include an N-channel transistor, a P-channel transistor, a CMOS circuit, or a combination thereof. At least one control circuit of the peripheral circuit portion PERI may include an address decoder circuit, a read circuit, a write circuit, and the like. At least one control circuit of the peripheral circuit portion PERI may include a planar channel transistor, a recess channel transistor, a buried gate transistor, and a fin channel transistor (FinFET) and the like, FIGS. 5 to 18 are cross-sectional views illustrating a method for fabricating a semiconductor device in accordance with an embodiment of the present invention.

Figure 5:
FIGS. 5 to 18 are cross-sectional views illustrating a method for fabricating a semiconductor device in accordance with an embodiment of the present invention.

Referring to FIG. 5, a seed layer 12 may be formed over a substrate 11. The seed layer 12 may include a perovskite material. The seed layer 12 may include a two-dimensional perovskite nanosheet. The seed layer 12 may be formed by epitaxial growth. The seed layer 12 may include a perovskite material of the formula $A_2Na_{n-3}M_nO_{3n+1}^-$ wherein A is Ca, Sr, or Ba, M=Nb, or Ta, and n satisfies the following expression $3 \leq n \leq 6$. For example, the seed layer 12 may include $Ca_2Nb_3O_{10}^-$. It may include $RENb_2O_7^-$ (RE=La), $LaNb_2O_7^-$, $La_{0.9}Eu_{0.05}Nb_2O_7^-$, $(SrTa_2O_7)^{2-}$, $RETa_2O_7^-$ (RE is Eu or Gd), $La_{0.7}Tb_{0.3}Ta_2O_7^-$, and $(Eu_{0.56}Ta_2O_7)^{2-}$.

A stack body SBD including a plurality of sacrificial layers 13, a plurality of channel layers 14, a plurality of high-k layers 15, and a plurality of metal layers 16 may be formed over the seed layer 12, The stack body SBD may have a structure in which the sacrificial layer 13, the channel layer 14, the high-k layer 15, and the metal layer 16 are alternately stacked in the mentioned order. Each of the sacrificial layer 13, the channel layer 14, the high-k layer 15, and the metal layer 16 may include a perovskite material. A plurality of sacrificial layers 13, a plurality of channel layers 14, a plurality of high-k layers 15, and a plurality of metal layers 16 forming the stack body SBD may be formed by an epitaxial growth process, respectively. The sacrificial layers 13, the channel layers 14, the high-k layers 15, and the metal layers 16 may include different epitaxial perovskite materials.

The channel layers 14 may include an epitaxial perovskite material, for example, a perovskite material of the formula $MSnO_3$ wherein M is Ba, Sr, or Zn. The high-k layers 15 may include epitaxial perovskite materials, for example $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$. The metal layers 16 may include an epitaxial perovskite material, for example, $LaNiO_3$, $SrRuO_3$, $LaRuO_3$, $(Ba, Sr)RuO_3$, $SrMo_3$, $BaMoO_3$ or $(Sr, Ba)PbO_3$.

The uppermost material of the stack body SBD may be the metal layer 16.

Figure 6:
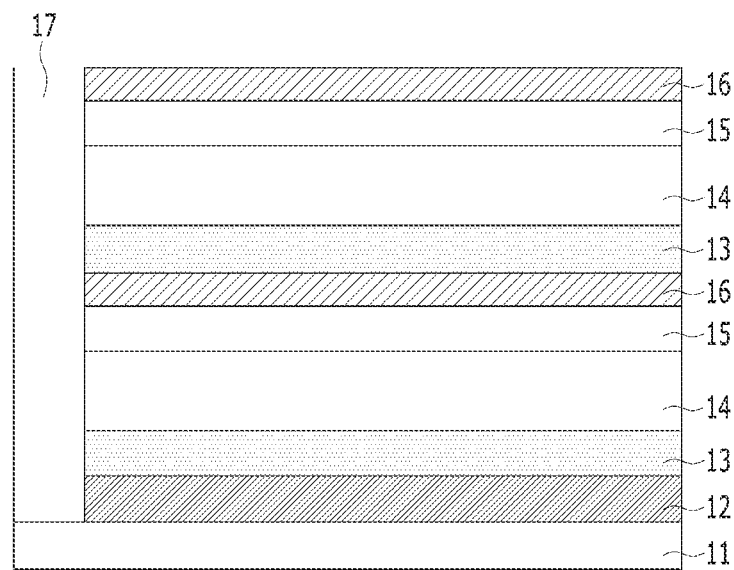

Referring to FIG. 6, at least one first opening 17 may be formed in the stack body SBD. The stack body SBD may be etched to form the first opening 17. For example, the stack body SBD and the seed layer 12 may be etched by using a mask layer as an etch mask. The first opening 17 may extend vertically through the stack body SBD and the seed layer 12. The first opening 17 may expose the surface of the substrate 11.

Figure 7:
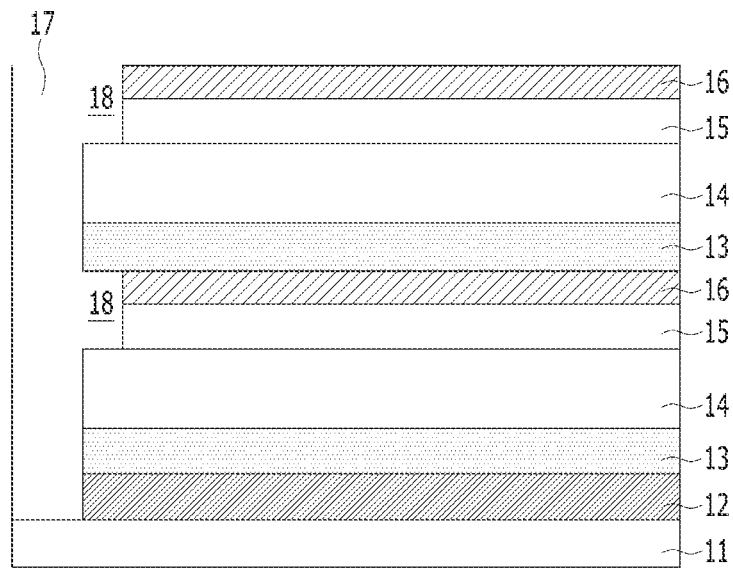

Referring to FIG. 7, a first recess 18 may be formed by partially etching the metal layer 16 and the high-k layer 15. The first recess 18 may expose a portion of the surface of the channel layer 14. The first recess 18 may extend laterally from the first opening 17.

Figure 8:
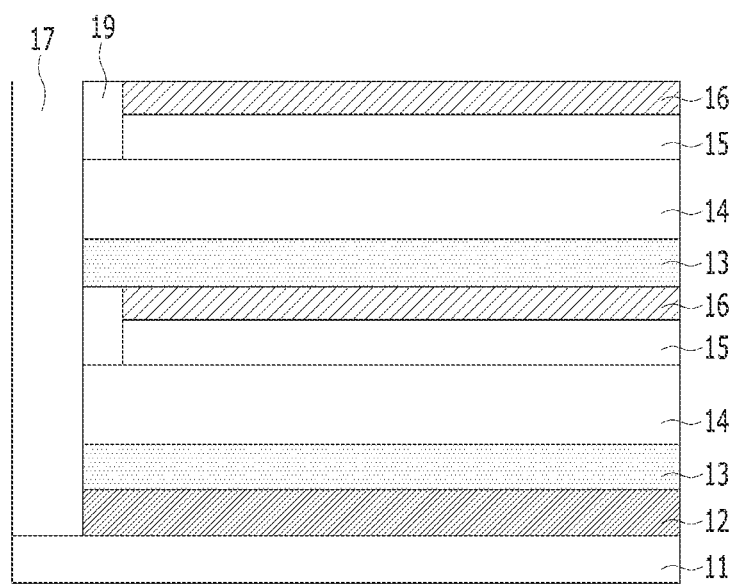

Referring to FIG. 8, the bit line-side capping layer 19 may fill the first recess 18. The bit line-side capping layer 19 may not fill the first opening 17. The bit line-side capping layer 19 may include silicon oxide, silicon nitride, or a combination thereof.

Figure 9:
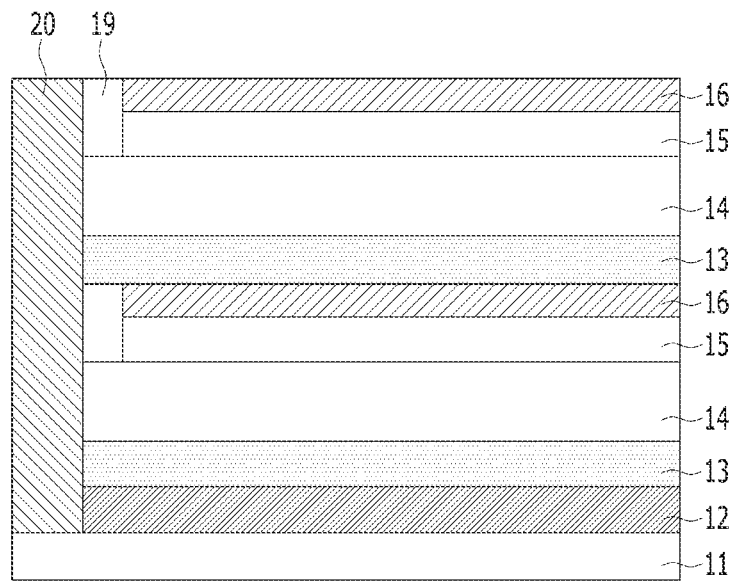

Referring to FIG. 9, a bit line 20 filling the first opening 17 may be formed. The bit line 20 may have a pillar shape filling the first opening 17. The bit line 20 may include titanium nitride, tungsten, or a combination thereof.

Figure 10:
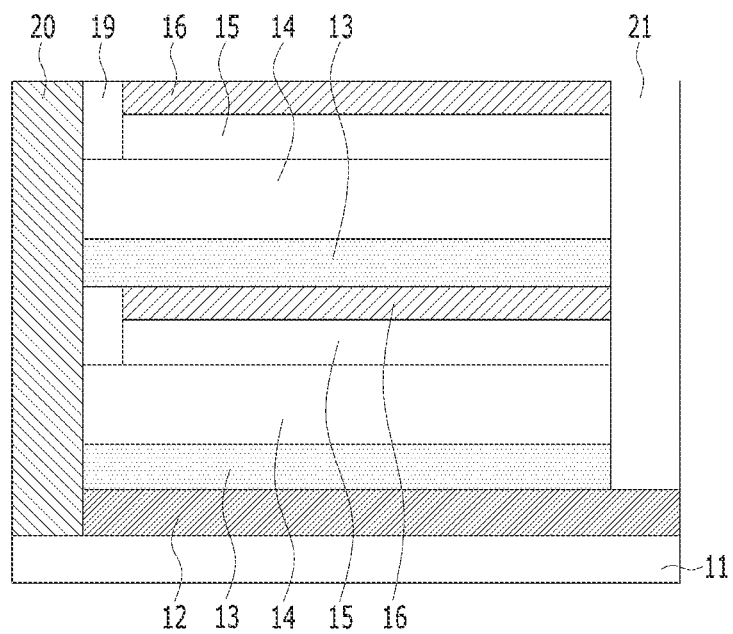

Referring to FIG. 10, a second opening 21 may be formed by etching another portion of the stack body SBD. The second opening 21 may extend vertically. The second opening 21 may have a hole shape penetrating another portion of the stack body SBD but not the seed layer 12.

Figure 11:
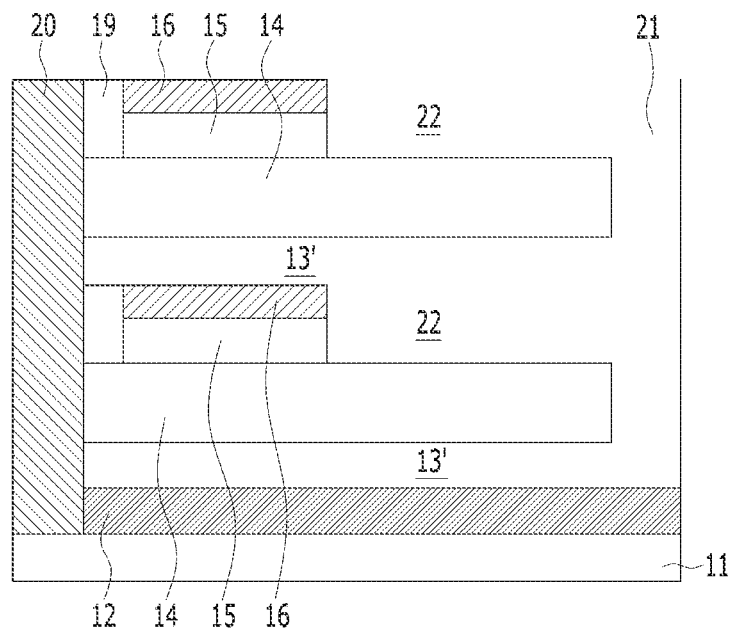

Referring to FIG. 11, the metal layers 16 and the high-k layers 15 may be selectively recessed through the second opening 21. Accordingly, the second recesses 22 may be formed. After the second recesses 22 are formed, the sacrificial layers 13 may be removed, thereby forming sacrificial recesses 13' extending from the second recess 22.

After the second recesses 22 are formed, the remaining high-k layers 15 and the metal layers 16 may be simply referred to as gate dielectric layers 15 and word lines 16, respectively.

By a series of the processes described above, a perovskite-based transistor may be formed. The perovskite-based transistor may be stacked in the order of the channel layer 14, the gate dielectric layer 15, and the word line 16. Each of the channel layer 14, the gate dielectric layer 15, and the word line 16 may include a perovskite-based material. The channel layer 14, the gate dielectric layer 15, and the word line 16 may be referred to as a perovskite-based channel layer, a perovskite-based gate dielectric layer, and a perovskite-based word line, respectively.

Figure 12:
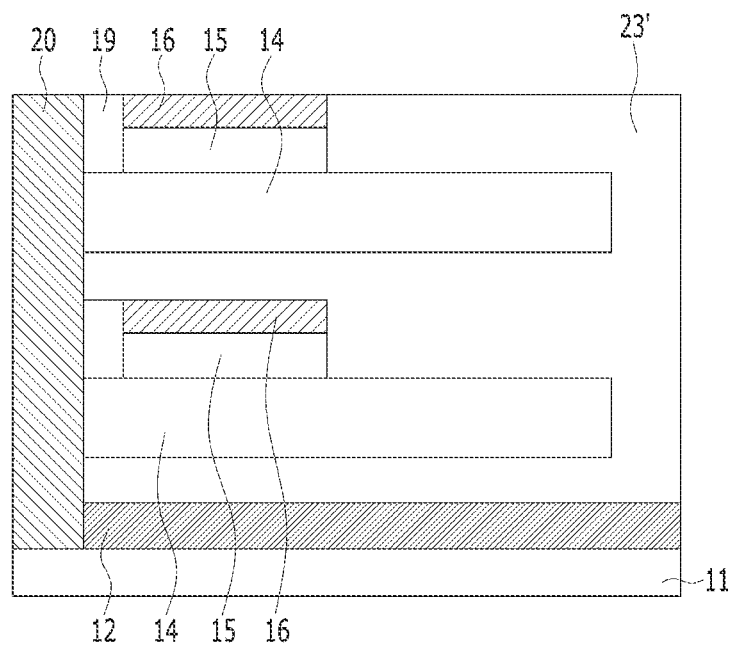

Referring to FIG. 12, a gap-fill layer 23' filling the second opening 21, the sacrificial recesses 13' and the second recesses 22 may be formed. The gap-fill layer 23' may include silicon oxide, silicon nitride, or a combination thereof.

Figure 13:
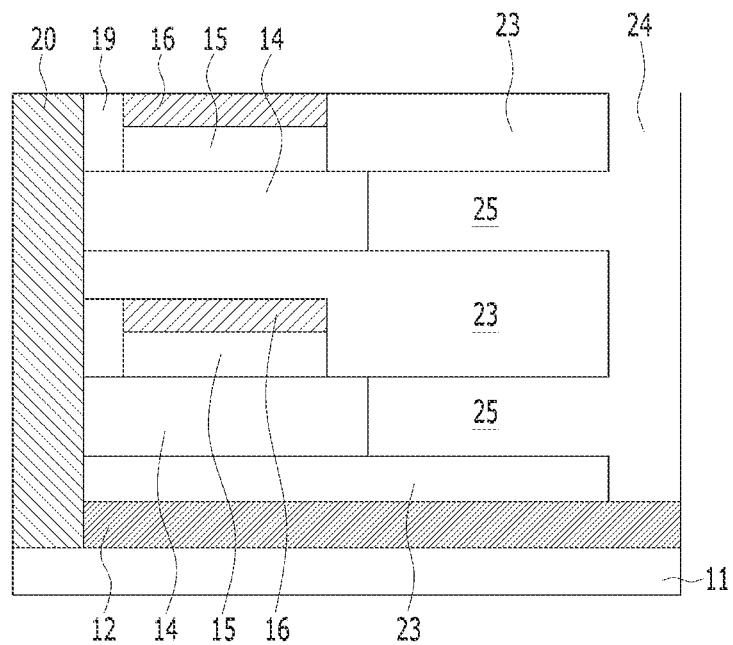

Referring to FIG. 13, a portion of the gap fill layer 23' may be etched to form a capacitor opening 24. After performing the processes for forming the capacitor opening 24, the remaining gap-fill layer 23 may be simply referred to as a capacitor-side capping layer 23.

After the capacitor opening 24 is formed, the channel layer 14 may be further recessed. Accordingly, an empty space 25 may be provided between the capacitor-side capping layers 23, and the empty space 25 may expose the other end of the channel layer 14.

Figure 14:
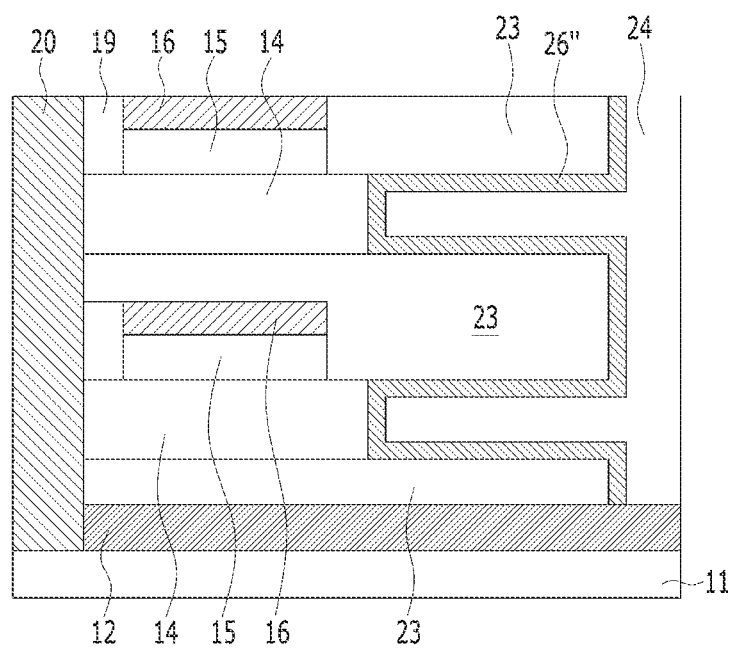
Figure 15:
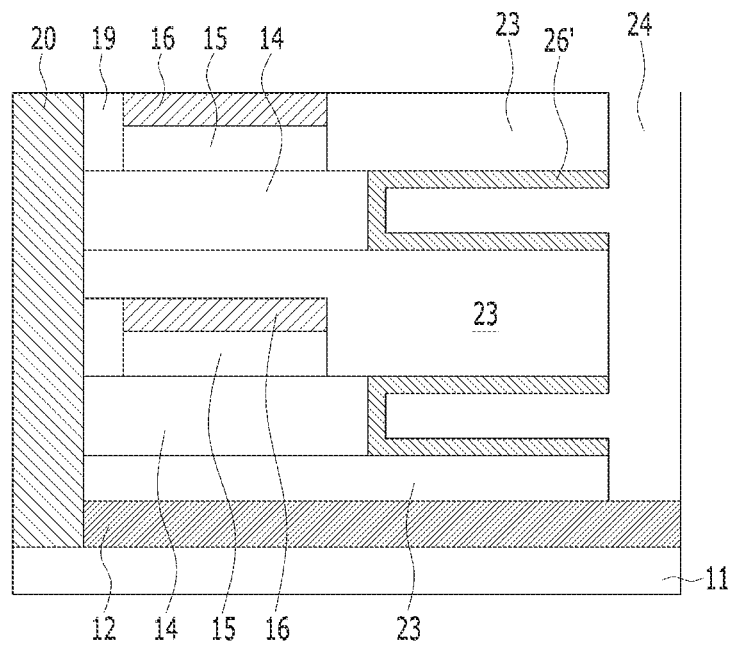

Referring to FIGS. 14 and 15, a storage node 26' may be formed. The storage node 26' may be formed by depositing a conductive material 26" and performing an etch-back process. The storage node 26' may include titanium nitride. The storage node 26' may have a laterally oriented cylinder shape.

Figure 16:
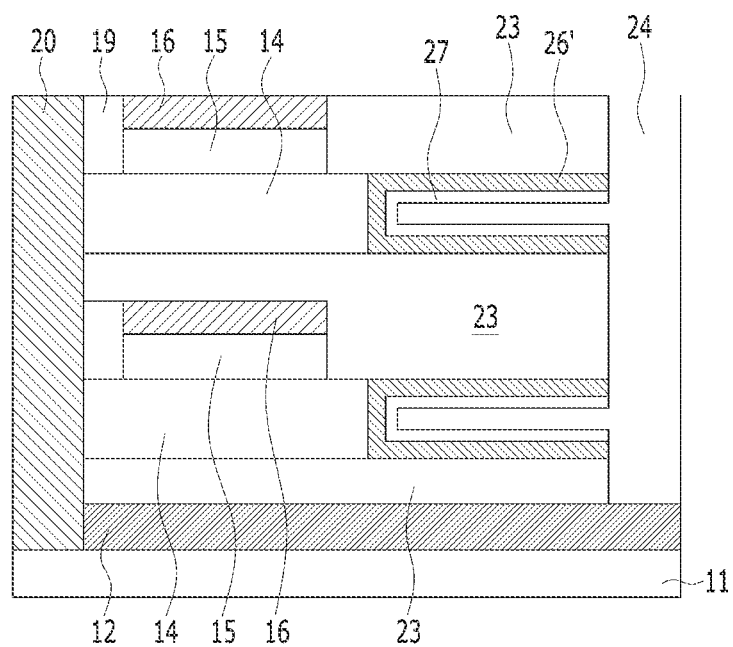

Referring to FIG. 16, a dielectric layer 27 may be formed over the storage node 26'. The dielectric layer 27 may include silicon oxide, silicon nitride, a high-k material, or a combination thereof. The high-k material may have a higher dielectric constant than silicon oxide. Silicon oxide ($SiO_2$) may have a dielectric constant of approximately 19, and the dielectric layer 27 may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 27 may be formed of a composite layer including two or more layers of the aforementioned high-k materials.

Figure 17:
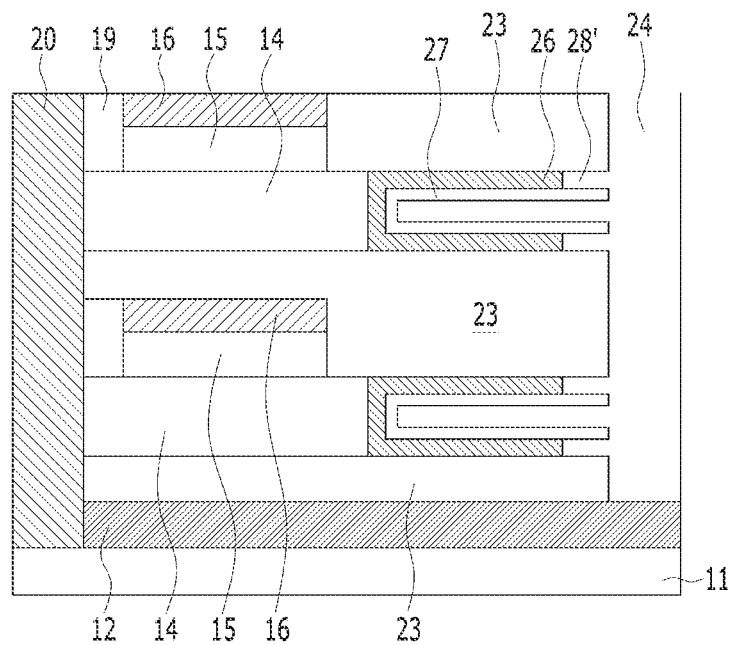

Referring to FIG. 17, air gaps 28' may be formed between the dielectric layer 27 and the capacitor-side capping layer 23. Portions of the storage node 26' may be selectively removed to form an air gap 28'. As a result, the storage node may remain as represented by the reference numeral '26'.

Figure 18:
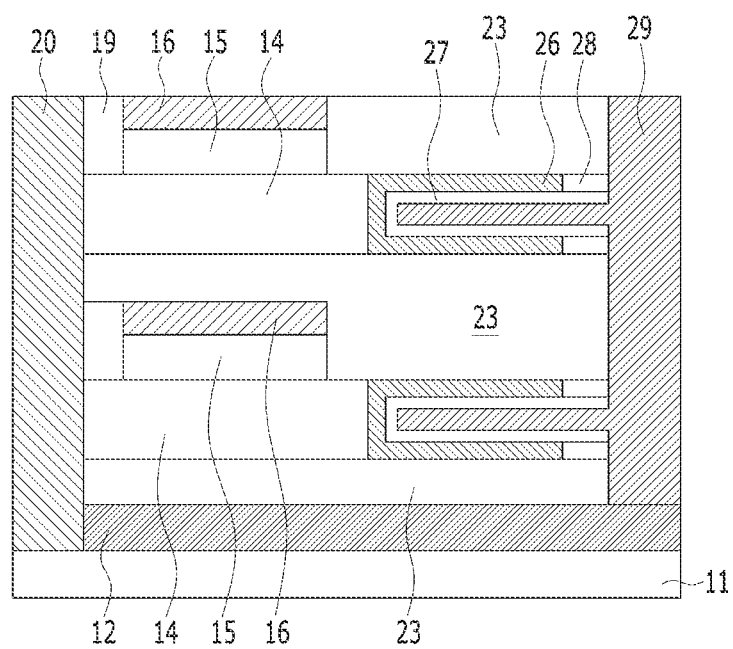

Referring to FIG. 18, node isolation layers 28 filling the air gaps 28' may be formed. The node isolation layers 28 may include a dielectric material, and the dielectric material may include silicon oxide, silicon nitride, or a combination thereof.

Subsequently, a plate node 29 filling the capacitor opening 24 may be formed over the dielectric layer 27. A bottom surface of the plate node 29 may be coupled to the seed layer 12.

The storage node 26, the dielectric layer 27, and the plate node 29 may form a capacitor.

Referring to FIGS. 5 to 18, the method for fabricating a semiconductor device may include forming a perovskite-based seed layer 12 over the substrate 11, forming a transistor in which the perovskite-based channel layer 14, the perovskite-based gate dielectric layer 15, and the perovskite-based word line 16 over the seed layer 12 in the mentioned order, forming a vertically oriented bit line 20 coupled to one-side end of the perovskite-based channel layer 14, and forming a capacitor including the storage node 26 which is coupled to another-side end of the perovskite-based channel layer 14.

Figure 19:
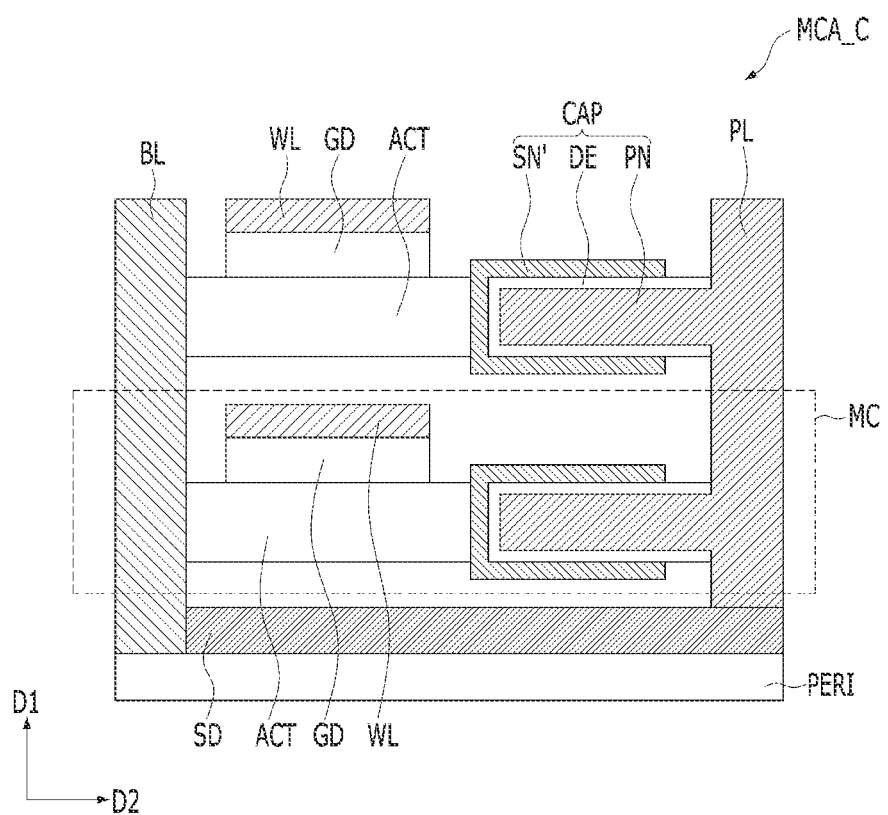
FIGS. 19 and 20 are schematic cross-sectional views illustrating memory cell arrays of semiconductor devices in accordance with other embodiments of the present invention.

FIG. 19 is a schematic cross-sectional view illustrating a memory cell array of a semiconductor device in accordance with another embodiment of the present invention. The memory cell array of FIG. 19 may be similar to the memory cell array shown in FIGS. 3 and 4. Hereinafter, detailed descriptions on the constituent elements of FIG. 19 also appearing in FIGS. 3 and 4 will be omitted.

Referring to FIGS. 3, 4 and 19, the memory cell array MCA_C of the semiconductor device may include a bit line BL, a transistor TR, and a capacitor CAP. The transistor TR may include a channel layer ACT and a word line WL, and the word line WL may be positioned over the channel layer ACT. The capacitor CAP may include a storage node SN', a dielectric layer DE, and a plate node PN.

The bit line BL may have a pillar shape extending in the first direction D1. The channel layer ACT may have a bar shape extending in the second direction D2 crossing the first direction D1. The word line WL may have a line shape extending in a third direction D3 crossing the first and second directions D1 and D2. The plate node PN of the capacitor CAP may be coupled to the plate line PL.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack which includes titanium nitride and tungsten over the titanium nitride.

The word line WL may extend long in the third direction D3, and the channel layer ACT may extend in the second direction D2. The channel layer ACT may be arranged laterally from the bit line BL in the second direction D2. The word line WL may have a single word line structure. A gate dielectric layer GD may be formed over the upper surface of the channel layer ACT.

The channel layer ACT may include a perovskite material. The channel layer ACT may include an epitaxial perovskite material. The channel layer ACT may be a perovskite channel and it may include $MSnO_3$ where M is Ba, Sr, or Zn.

The word line WL may include a perovskite material. The word line WL may include an epitaxial perovskite material. The word line WL may include $LaNiO_3$, $SrRuO_3$, $LaRuO_3$, $(Ba, Sr)RuO_3$, $SrMo_3$, $BaMoO_3$ or $(Sr, Ba)PbO_3$.

A gate dielectric layer GD may be formed between the channel layer ACT and the word line WL. The gate dielectric layer GD may include a perovskite material. The gate dielectric layer GD may include an epitaxial perovskite material. For example, the gate dielectric layer GD may include $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$.

The capacitor CAP may be positioned laterally from the transistor TR in the second direction D2. The capacitor CAP may include a storage node SN' extending laterally from the channel layer ACT in the second direction D2. The capacitor CAP may further include a dielectric layer DE and a plate node PN over the storage node SN'. The storage node SN', the dielectric layer DE, and the plate node PN may be arranged laterally in the second direction D2. The storage node SN' may have a laterally oriented cylinder-shape. The dielectric layer DE may conformally cover the cylindrical inner wall of the storage node SN'. The plate node PN may have a shape extending from the dielectric layer DE to the cylindrical inner wall of the storage node SN'. The plate node PN may be coupled to the plate line PL.

The storage node SN' may have a three-dimensional structure, and the storage node SN' of the three-dimensional structure may have a lateral three-dimensional structure which is oriented in the second direction D2. As an example of the three-dimensional structure, the storage node SN' may have a cylinder shape. The storage node SN' may be coupled to the other-side end of the channel layer ACT.

A portion of the plate node PN may serve as a plate line PL.

The capacitor CAP of FIG. 19 may be a concave-type capacitor. The storage node SN' of FIG. 19 may have a higher vertical height in the first direction D1 than the storage node SN of FIG. 4. The storage node SN and the channel layer ACT of FIG. 4 may have the same vertical height in the first direction D1. The storage node SN' and the channel layer ACT of FIG. 19 may have different vertical heights in the first direction D1, for example, the storage node SN' may have a higher vertical height in the first direction D1 than the channel layer ACT.

Figure 20:
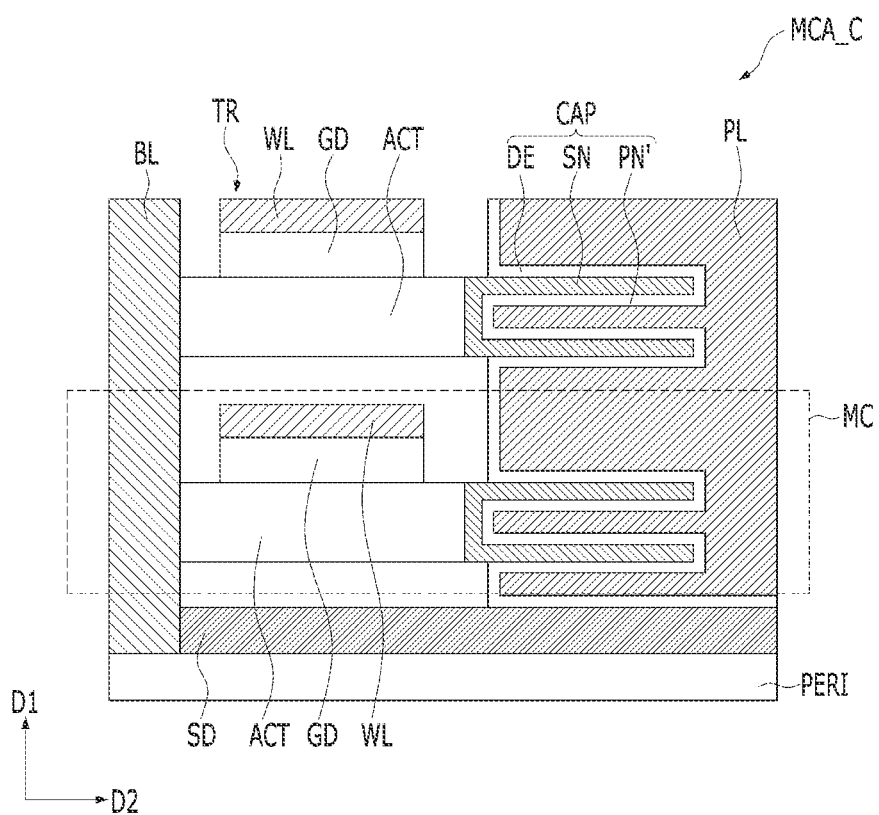

FIG. 20 is a schematic cross-sectional view illustrating a memory cell array of a semiconductor device in accordance with other embodiments of the present invention. The memory cell array of FIG. 20 may be similar to the memory cell array of FIGS. 3 and 4. Hereinafter, detailed descriptions on the constituent elements of FIG. 20 also appearing in FIGS. 3 and 4 will be omitted.

Referring to FIGS. 3, 4 and 20, the memory cell array MCA_C of the semiconductor device may include a bit line BL, a transistor TR, and a capacitor CAP. The transistor TR may include a channel layer ACT and a word line WL, and the word line WL may be positioned over the channel layer ACT. The capacitor CAP may include a storage node SN, a dielectric layer DE, and a plate node PN'.

The bit line BL may have a pillar shape extending in the first direction D1. The channel layer ACT may have a bar shape extending in the second direction D2 crossing the first direction D1. The word line WL may have a line shape extending in the third direction D3 crossing the first and second directions D1 and D2. The plate node PN' of the capacitor CAP may be coupled to the plate line PL.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over titanium nitride.

The word line WL may extend long in the third direction D3, and the channel layer ACT may extend in the second direction D2. The channel layer ACT may be arranged laterally from the bit line BL in the second direction D2. The word line WL may have a single word line structure. A gate dielectric layer GD may be formed over the upper surface of the channel layer ACT.

The channel layer ACT may include a perovskite material. The channel layer ACT may include an epitaxial perovskite material. The channel layer ACT may be a perovskite channel and it may include a perovskite material of the formula $MSnO_3$ wherein M is Ba, Sr, or Zn.

The word line WL may include a perovskite material. The word line WL may include an epitaxial perovskite material. The word line WL may include $LaNiO_3$, $SrRuO_3$, $LaRuO_3$, $(Ba, Sr)RuO_3$, $SrMoO_3$, $BaMoO_3$ or $(Sr, Ba)PbO_3$.

A gate dielectric layer GD may be formed between the channel layer ACT and the word line WL. The gate dielectric layer GD may include a perovskite material. The gate dielectric layer GD may include an epitaxial perovskite material. For example, the gate dielectric layer GD may include $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$.

The capacitor CAP may be positioned laterally from the transistor TR in the second direction D2. The capacitor CAP may include a storage node SN extending laterally from the channel layer ACT in the second direction D2. The capacitor CAP may further include a dielectric layer DE and a plate node PN' over the storage node SN. The storage node SN, the dielectric layer DE, and the plate node PN' may be arranged laterally in the second direction D2. The storage node SN may have a laterally oriented cylinder-shape. The dielectric layer DE may conformally cover the cylindrical inner wall and the cylindrical outer wall of the storage node SN. The plate node PN' may have a shape extending to the cylindrical inner wall and the cylindrical outer wall of the storage node SN over the dielectric layer DE. The plate node PN' may be coupled to the plate line PL.

The storage node SN may have a three-dimensional structure, and the storage node SN of the three-dimensional structure may have a lateral three-dimensional structure which is oriented in the second direction D2. As an example of the three-dimensional structure, the storage node SN may have a cylinder shape.

A portion of the plate node PN' may serve as a plate line PL.

The capacitor CAP may be a cylindrical capacitor. The plate node PN' of FIG. 20 may further include a portion extending between the storage nodes SN. In other words, the plate node PN' may further include a portion extending to the cylindrical inner wall and the cylindrical outer wall of the storage node SN over the dielectric layer DE.

The storage node SN and the channel layer ACT of FIG. 20 may have the same vertical height in the first direction D1. According to another embodiment of the present invention, the storage node SN may have a higher vertical height in the first direction D1 than the channel layer ACT.

Figure 21:
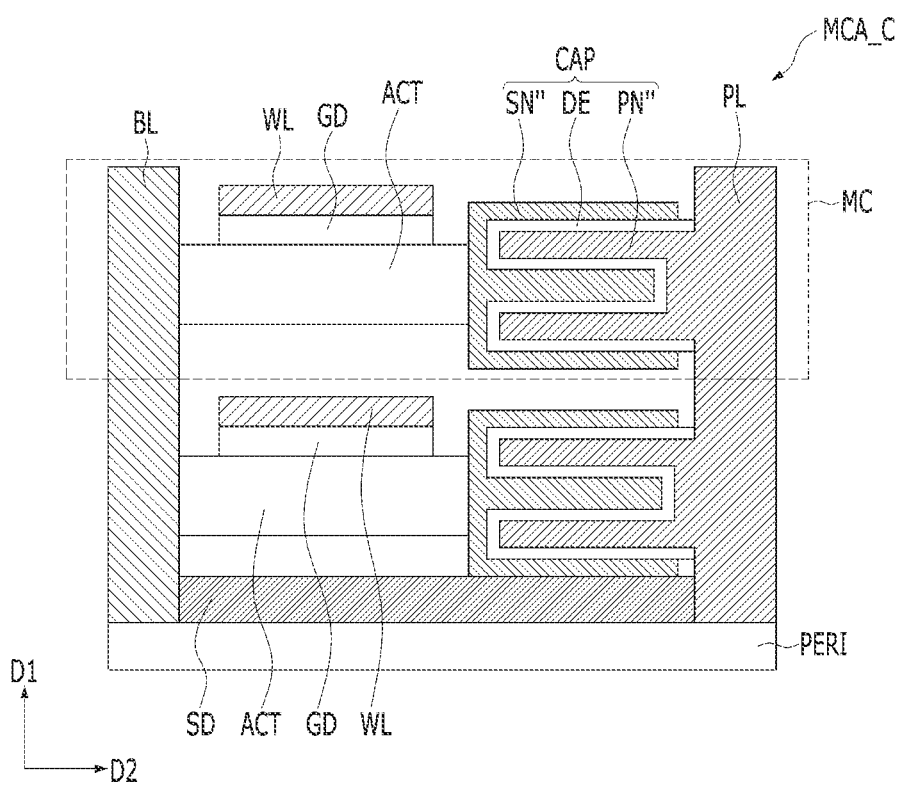
FIG. 21 is a schematic cross-sectional view illustrating a memory cell array of a semiconductor device in accordance with another embodiment of the present invention.

FIG. 21 is a schematic cross-sectional view illustrating a memory cell array of a semiconductor device in accordance with another embodiment of the present invention. The memory cell array of FIG. 21 may be similar to the memory cell array shown in FIGS. 3, 4 and 19. Hereinafter, detailed descriptions on the constituent elements of FIG. 21 also appearing in FIGS. 3, 4 and 19 will be omitted.

Referring to FIGS. 3, 4, 19 and 21, the memory cell array MCA_C of the semiconductor device may include a bit line BL, a transistor TR, and a capacitor CAP. The transistor TR may include a channel layer ACT and a word line WL, and the word line WL may be positioned over the channel layer ACT. The capacitor CAP may include a storage node SN", a dielectric layer DE, and a plate node PN".

The bit line BL may have a pillar shape extending in the first direction D1. The channel layer ACT may have a bar shape extending in the second direction D2 crossing the first direction D1. The word line WL may have a line shape extending in a third direction D3 crossing the first and second directions D1 and D2. The plate node PN of the capacitor CAP may be coupled to the plate line PL.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack which includes titanium nitride and tungsten over titanium nitride.

The word line WL may extend long in the third direction D3, and the channel layer ACT may extend in the second direction D2. The channel layer ACT may be arranged laterally from the bit line BL in the second direction D2. The word line WL may have a single word line structure. A gate dielectric layer GD may be formed over the upper surface of the channel layer ACT.

The channel layer ACT may include a perovskite material. The channel layer ACT may include an epitaxial perovskite material. The channel layer ACT may be a perovskite channel and it may include $MSnO_3$ (M=Ba, Sr, Zn).

The word line WL may include a perovskite material. The word line WL may include an epitaxial perovskite material. The word line WL may include $LaNiO_3$, $SrRuO_3$, $LaRuO_3$, $(Ba, Sr)RuO_3$, $SrMo_3$, $BaMoO_3$ or $(Sr, Ba)PbO_3$.

A gate dielectric layer GD may be formed between the channel layer ACT and the word line WL. The gate dielectric layer GD may include a perovskite material. The gate dielectric layer GD may include an epitaxial perovskite material. For example, the gate dielectric layer GD may include $SrTiO_3$, $BaTiO_3$, $(Sr, Ba)TiO_3$, $(Ba, Ca) (Zr, Ti)O_3$, $Pb(Zr, Ti)O_3$ or $(Pb, La)(Zr, Ti)O_3$.

The capacitor CAP may be positioned laterally from the transistor TR in the second direction D2. The capacitor CAP may include a storage node SN" extending laterally from the channel layer ACT in the second direction D2. The capacitor CAP may further include a dielectric layer DE and a plate node PN" over the storage node SN'. The storage node SN", the dielectric layer DE, and the plate node PN" may be arranged laterally in the second direction D2. The storage node SN" may have a laterally oriented cylinder-shape. The dielectric layer DE may conformally cover the cylindrical inner wall of the storage node SN". The plate node PN" may have a shape extending from the dielectric layer DE to the cylindrical inner wall of the storage node SN". The plate node PN" may be coupled to the plate line PL.

The storage node SN" may have a three-dimensional structure, and the storage node SN" of the three-dimensional structure may have a lateral three-dimensional structure which is oriented in the second direction D2. As an example of the three-dimensional structure, the storage node SN" may have a cylinder shape. The storage node SN may be coupled to the other-side end of the channel layer ACT. The storage node SN" may have a multi-cylinder shape. For example, the multi-cylinder shape may refer to a structure in which at least two cylinders are merged. In embodiment, the storage node SN" may have a double cylinder shape. The plate node PN" may include a plurality of inner nodes. The inner nodes may be located within inner walls of cylinders of the storage node SN". The Inner nodes of the plate node PN" may be connected to the plate line PL. The inner nodes of the plate node PN" and the plate line PL may have an integral structure. The inner nodes of the plate node PN" may serve as a plate line PL.

According to the above-described embodiments of the present invention, epitaxial $MSnO_3$, where M is Ba, Sr, or Zn, may be formed as the channel layer ACT or a channel. In other words, the conductive metal oxide may have an energy band-gap (Eg) of approximately 3 eV or more, and the mobility may be improved to approximately 300 $cm^2/Vs$ due to an effective mass which is smaller than that of polysilicon or monocrystalline silicon.

Also, as an epitaxial perovskite material having a high dielectric constant is formed as the gate dielectric layer GD, a material having a dielectric constant of approximately 100 may be introduced, thereby optimizing the trap density (Dit), operating rate, and operating voltage.

Also, since both of the gate dielectric layer GD and the word line WL are perovskite materials, the interface quality between the channel layer ACT and the gate dielectric layer GD may be improved compared to monocrystalline silicon. In addition, since a perovskite material is formed as the channel layer ACT, cell-to-cell variation according to the crystallinity of the channel layer ACT may be suppressed.

According to an embodiment of the present invention, mobility of a transistor may be improved by forming an epitaxial perovskite material as a channel layer.

According to an embodiment of the present invention, a high dielectric constant of approximately 100 or more may be obtained by forming an epitaxial perovskite material having a high dielectric constant as a gate dielectric layer, thereby optimizing the operation rate and operation voltage.

According to an embodiment of the present invention, since a gate dielectric layer and a word line individually include an epitaxial perovskite material, the quality of the interface between the channel layer and the gate dielectric layer may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
 a substrate;
 a seed layer over the substrate;
 a perovskite-based channel layer over the seed layer;
 a bit line coupled to one side of the perovskite-based channel layer and extending in a direction perpendicular to the substrate;
 a capacitor coupled to another side of the perovskite-based channel layer;
 a word line crossing an upper surface of the perovskite-based channel layer; and
 a gate dielectric layer disposed between the word line and the perovskite-based channel layer.

2. The semiconductor device of claim 1, wherein the bit line is coupled to the substrate through the seed layer.

3. The semiconductor device of claim 1, wherein the seed layer includes an epitaxial perovskite material.

4. The semiconductor device of claim 1, wherein the seed layer includes a two-dimensional perovskite nanosheet.

5. The semiconductor device of claim 1, wherein the seed layer includes a material of the formula $A_2Na_{n-3}MnO_{3n+1}^-$ where A is Ca, Sr, or Ba, M is Nb, or Ta, and n satisfies the following expression $3 \leq n \leq 6$.

6. The semiconductor device of claim 1, wherein the seed layer includes $Ca_2Nb_3O_{10}^-$, $RENb_2O_7^-$ (RE is La), $LaNb_2O_7^-$, $La_{0.9}Eu_{0.05}Nb_2O_7^-$, $(SrTa_2O_7)^{2-}$, $RETa2O_7^-$ (RE is Eu or Gd), $La_{0.7}Tb_{0.3}Ta_2O_7^-$, and $(Eu_{0.56}Ta_2O_7)^{2-}$.

7. The semiconductor device of claim 1, wherein the perovskite-based channel layer includes a conductive epitaxial perovskite material.

8. The semiconductor device of claim 1, wherein the perovskite-based channel layer includes a material of the formula $MSnO_3$ wherein M is Ba, Sr, or Zn.

9. The semiconductor device of claim 1, wherein the word line includes an epitaxial perovskite material.

10. The semiconductor device of claim 1, wherein the word line includes $LaNiO_3$, $SrRuO_3$, $LaRuO_3$, $(Ba, Sr)RuO_3$, $SrMo_3$, $BaMoO_3$ or $(Sr, Ba)PbO_3$.

11. The semiconductor device of claim 1, wherein the gate dielectric layer includes an epitaxial perovskite material.

12. The semiconductor device of claim 1, wherein the gate dielectric layer includes $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$.

13. The semiconductor device of claim 1, wherein each of the seed layer, the channel layer, and the word line includes an epitaxial perovskite material.

14. A semiconductor device, comprising:
   a substrate;
   a perovskite-based transistor including a perovskite-based channel layer which is laterally oriented parallel to the substrate over the substrate;
   a bit line coupled to one side of the perovskite-based transistor and extending in a direction perpendicular to the substrate; and
   a capacitor coupled to another side of the perovskite-based transistor.

15. The semiconductor device of claim 14, wherein the perovskite-based transistor further includes:
   a perovskite-based gate dielectric layer over the perovskite-based channel layer; and
   a perovskite-based word line over the perovskite-based gate dielectric layer.

16. The semiconductor device of claim 15, wherein the perovskite-based word line includes $LaNiO_3$, $SrRuO_3$, $LaRuO_3$, $(Ba, Sr)RuO_3$, $SrMo_3$, $BaMoO_3$ or $(Sr, Ba)PbO_3$.

17. The semiconductor device of claim 15, wherein the perovskite-based gate dielectric layer includes $SrTiO_3$, $BaTiO_3$, $(Sr, Ba)TiO_3$, $(Ba, Ca)(Zr, Ti)O_3$, $Pb(Zr, Ti)O_3$ or $(Pb, La)(Zr, Ti)O_3$.

18. The semiconductor device of claim 14, wherein the perovskite-based channel layer includes a material of the formula $MSnO_3$ wherein M is Ba, Sr, or Zn.

19. A semiconductor device, comprising:
   a perovskite-based transistor over a substrate;
   a bit line coupled to one side of the perovskite-based transistor and extending in a direction perpendicular to the substrate; and
   a capacitor coupled to another side of the perovskite-based transistor,
   wherein the perovskite-based transistor includes:
      a perovskite-based channel layer laterally oriented to be parallel to the substrate;
      a perovskite-based gate dielectric layer over the perovskite channel layer; and
      a perovskite-based word line over the perovskite-based gate dielectric layer.

20. The semiconductor device of claim 19, wherein each of the perovskite-based channel layer, the perovskite-based gate dielectric layer, and the perovskite-based word line includes an epitaxial perovskite material.

* * * * *